(12) United States Patent
Yamaguchi et al.

(10) Patent No.: US 7,705,964 B2
(45) Date of Patent: Apr. 27, 2010

(54) EXPOSURE SYSTEM AND EXPOSURE METHOD

(75) Inventors: Kinya Yamaguchi, Utsunomiya (JP); Yuichi Takamura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 915 days.

(21) Appl. No.: 11/396,795

(22) Filed: Apr. 3, 2006

(65) Prior Publication Data
US 2006/0221319 A1   Oct. 5, 2006

(30) Foreign Application Priority Data
Apr. 4, 2005   (JP)   ............... 2005-107739

(51) Int. Cl.
*G03B 27/42*   (2006.01)
*G03B 27/58*   (2006.01)
*G03B 27/32*   (2006.01)

(52) U.S. Cl. ............... 355/53; 355/72; 355/77
(58) Field of Classification Search ............... 355/40, 355/53, 72–74, 77; 250/492.1, 492.2, 492.22, 250/548, 442.11; 356/399–401; 430/5, 22, 430/30, 8, 311; 378/34, 35, 205
See application file for complete search history.

(56) References Cited

U.S. PATENT DOCUMENTS

| | | | | |
|---|---|---|---|---|
| 6,188,467 B1 * | 2/2001 | Yamatsu et al. | ............... | 355/72 |
| 6,414,744 B1 * | 7/2002 | Kuiper et al. | ............... | 355/75 |
| 6,697,145 B1 * | 2/2004 | Aoyama | ............... | 355/53 |
| 2001/0028456 A1 * | 10/2001 | Nishi | ............... | 356/400 |
| 2002/0148961 A1 * | 10/2002 | Nakasuji et al. | ............... | 250/311 |
| 2002/0196421 A1 * | 12/2002 | Tanaka et al. | ............... | 355/72 |
| 2004/0227925 A1 * | 11/2004 | Sato | ............... | 355/72 |
| 2005/0030537 A1 | 2/2005 | Hayashi et al. | ............... | 356/401 |
| 2005/0140960 A1 * | 6/2005 | Andreas Hazenberg et al. | ............... | 355/72 |
| 2006/0114444 A1 * | 6/2006 | Kuo | ............... | 355/72 |

FOREIGN PATENT DOCUMENTS

JP   2005-057205   3/2005

* cited by examiner

*Primary Examiner*—Peter B Kim
*Assistant Examiner*—Christina Riddle
(74) *Attorney, Agent, or Firm*—Cowan, Liebowitz & Latman, P.C.

(57) ABSTRACT

An exposure system for exposing a substrate to radiation is disclosed. The system comprises an exposure unit configured to expose the substrate to radiation, an exposure chamber configured to accommodate the exposure unit, an alignment measurement unit arranged outside the exposure chamber and configured to measure a position of an alignment mark on the substrate, and a load-lock chamber arranged between the exposure chamber and the alignment measurement unit.

12 Claims, 4 Drawing Sheets

EXPOSURE SYSTEM AND EXPOSURE METHOD

FIELD OF THE INVENTION

The present invention relates to an exposure system ad method such as, for example, an exposure system and method for exposing a substrate coated with a photosensitive material to radiation such as charged particles, an $F_2$ laser light, or EUV (extreme ultraviolet) light.

BACKGROUND OF THE INVENTION

An exposure apparatus used to manufacture a device such as a semiconductor device comprises an exposure unit, alignment measurement unit, substrate stage, and the like. The exposure unit includes an exposure light source, illumination system and projection optical system. An exposure beam containing pattern information is generated by an exposure light from the light source illuminating an original plate having a pattern. The projection system projects the exposure beam containing the pattern information of the original plate onto a substrate. The alignment measurement unit measures the position of an alignment mark formed on the substrate before exposure. The substrate stage moves the substrate before exposure to an alignment measurement position immediately under the alignment measurement unit, and the substrate after alignment to an exposure position immediately under the exposure unit.

Conventionally, the illuminance of the light source of the exposure unit has been increased to improve the throughput of the exposure apparatus. The performances of the respective units have been improved such as pursuing an alignment measurement unit that performs a measurement process within a shorter period of time or a substrate stage that moves at higher speed. Furthermore, an exposure apparatus has been put into practical use in which two substrate stages are provided and, while one substrate stage is used as an exposure stage, the other substrate stage is used as an alignment measurement stage, to perform exposure operation and alignment operation in a parallel manner.

In order to form a small latent image pattern on a substrate, as an exposure beam, a short-wavelength exposure beam has been introduced into practical use, e.g., a charged particle beam such as an electron beam, an $F_2$ laser beam, or an EUV beam. To use such an exposure beam, the optical path of the exposure beam from the exposure light source to the substrate must be arranged in a space held at a predetermined vacuum degree or a nitrogen space with a predetermined concentration depending on the type of exposure light source. For this purpose, various types of units in the exposure apparatus, e.g., the exposure unit, alignment measurement unit, substrate stage, and the like are arranged in a chamber, and the interior of the chamber is maintained at a reduced-pressure environment or nitrogen atmosphere.

When the exposure apparatus is configured to comprise a single substrate stage, it cannot perform the exposure operation and alignment measurement apparatus simultaneously. When the exposure apparatus comprises two stages, it can perform the exposure operation and alignment measurement operation simultaneously, but the size of its stage arrangement becomes inevitably large. To cope with the trend a larger wafer size, both the exposure apparatus comprising the single stage and the exposure apparatus comprising the two stages tend to have larger sizes.

When the stage arrangement size becomes large in this manner, if the exposure apparatus uses a short-wavelength exposure beam, e.g., a charged particle beam such as an electron beam, an $F_2$ laser beam, or an EUV beam, the size of the chamber which accommodates the units such as the exposure unit, alignment measurement unit, and substrate stage and isolates its inner environment from the outer environment (atmosphere) becomes large. An increase in chamber size leads to a bulky vacuum device or purge device which maintains the inner space of the chamber at a predetermined vacuum degree or atmosphere.

In addition, an increase in chamber size increases the time required to change the inner space of the chamber from the atmospheric environment to a predetermined reduced-pressure environment or atmosphere when the exposure apparatus is started.

To suppress the capacity of the chamber, it is effective to arrange the alignment measurement unit outside the exposure chamber and perform alignment measurement in the atmosphere, as proposed in this application. With this scheme, to transport a substrate after alignment measurement into the exposure chamber, typically, a load-lock chamber which substitutes the outer atmosphere in the substrate transport path by the atmosphere in the exposure chamber is arranged adjacent to the exposure chamber.

In this case, note that when the load-lock chamber in an atmospheric state is to be exhausted to a predetermined vacuum degree, the substrate is deprived of heat due to adiabatic expansion, so the substrate temperature decreases and the substrate shrinks. If the substrate size changes, a value obtained by alignment measurement in the atmosphere may include an error in the exposure chamber. Even when the load-lock chamber is purged with a gas such as nitrogen, if the atmospheric temperature and the gas temperature differ, the substrate size changes in accordance with the temperature difference between them.

SUMMARY OF THE INVENTION

The present invention has been made in view of the above background, and has as its exemplary object to make an exposure chamber in which an exposure unit is arranged compact.

According to the present invention, there is provided an exposure system for exposing a substrate to radiation, the system comprising an exposure unit configured to expose the substrate to radiation, an exposure chamber configured to accommodate the exposure unit, an alignment measurement unit arranged outside the exposure chamber and configured to measure a position of an alignment mark on the substrate, and a load-lock chamber arranged between the exposure chamber and the alignment measurement unit.

According to the preferred embodiment of the present invention, the system can include a plurality of combinations each of which includes the exposure unit, the exposure chamber, and the load-lock chamber, and the alignment measurement unit can be shared by the plurality of combinations.

According to the preferred embodiment of the present invention, the system can include a plurality of the alignment measurement units.

According to the preferred embodiment of the present invention, the system can further comprises an alignment scope arranged in at least one of the load-lock chamber and the exposure chamber and configured to measure a position of the alignment mark, and a controller configured to calculate a position of a region, to be exposed to radiation, on the substrate based on first measurement performed by the alignment measurement unit and second measurement performed by the alignment scope, wherein the system is configured such that the alignment scope measures positions of alignment marks fewer than alignment marks of which positions the alignment measurement unit measures.

According to the preferred embodiment of the present invention, the controller can be configured to correct the position of the region, which is obtained based on the first measurement, based on the first measurement and the second measurement.

According to the present invention, there is provided an exposure method of exposing a substrate to radiation, the method comprising steps of performing, using an alignment measurement unit, first measurement of a position of an alignment mark on the substrate, outside an exposure chamber which accommodates an exposure unit configured to expose the substrate to radiation, conveying the substrate, for which the first measurement has been performed, into the exposure chamber through a load-lock chamber, aligning, in the exposure chamber, the conveyed substrate based on the first measurement, and exposing, in the exposure chamber, the aligned substrate to radiation using the exposure unit.

According to the preferred embodiment of the present invention, the method can employ a plurality of combinations each of which includes the exposure unit, the exposure chamber, and the load-lock chamber, and the alignment measurement unit is shared by the plurality of combinations.

According to the preferred embodiment of the present invention, the method can employ a plurality of the alignment measurement units.

According to the preferred embodiment of the present invention, the method can further comprises steps of performing second measurement of a position of the alignment mark using an alignment scope arranged in at least one of the load-lock chamber and the exposure chamber, and calculating a position of a region to be exposed to radiation on the substrate based on the first measurement and the second measurement, wherein the second measurement step measures positions of alignment marks fewer than alignment marls of which positions the first measurement step measures.

According to the preferred embodiment of the present invention, the calculating step can corrects the position of the region, obtained based on the first measurement, based on the first measurement and the second measurement.

According to the present invention, for example, the exposure chamber where the exposure unit is to be arranged can be made compact.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

The preferred embodiment of the present invention will be described with reference to the accompanying drawings.

Figure 1:
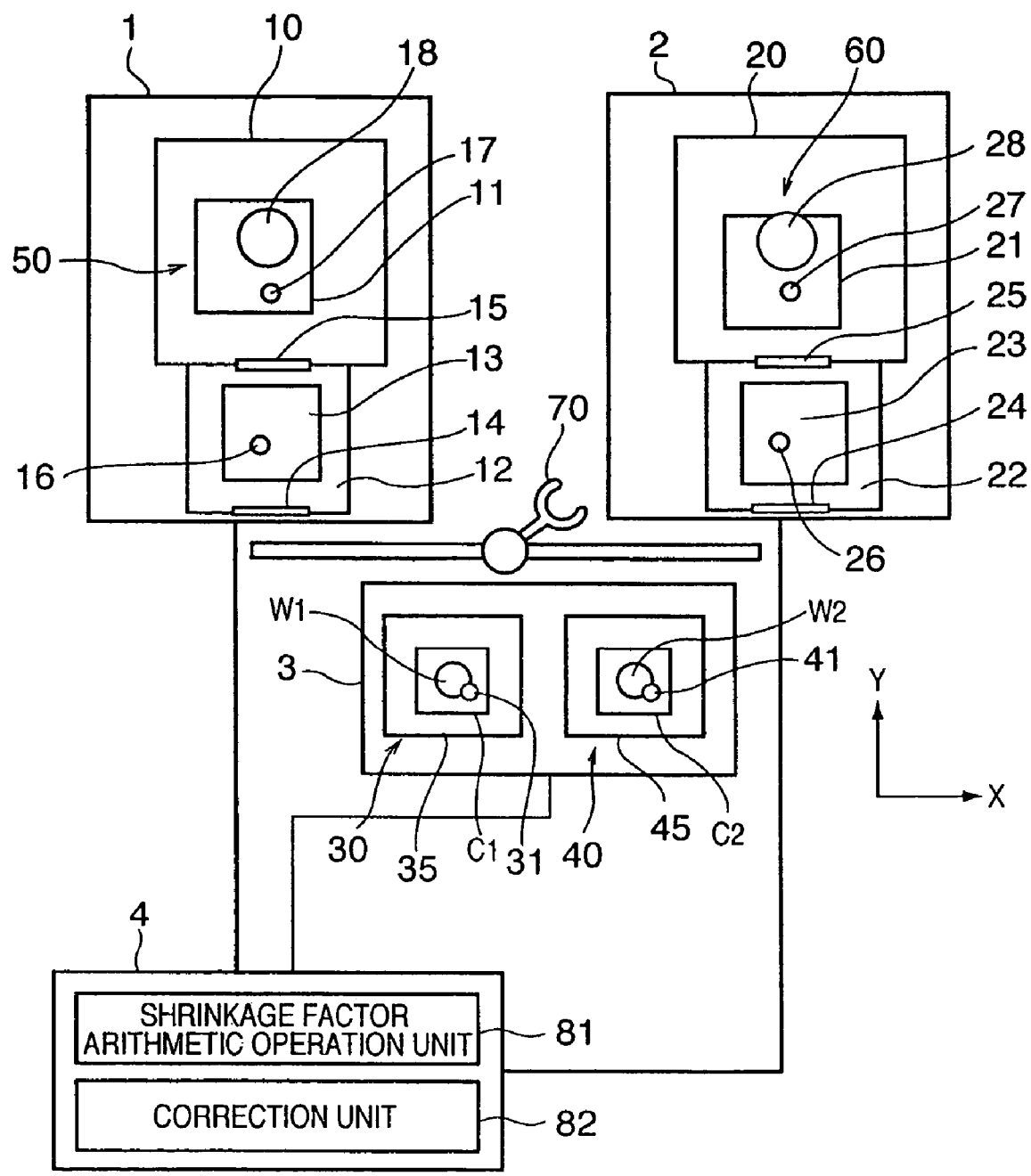
FIG. 1 is a view showing the schematic arrangement of an exposure system according to a preferred embodiment of the present invention.

FIG. 1 is a view showing the schematic arrangement of an exposure system according to a preferred embodiment of the present invention. The exposure system according to the preferred embodiment of the present invention includes at least one exposure apparatus, preferably, a plurality of exposure apparatuses 1 and 2, an alignment measurement device 3, and a controller 4.

The exposure apparatus 1 forms a latent image pattern by photosensitizing a photosensitive agent applied to a substrate (e.g., a wafer or glass plate) with an exposure beam, and can be configured as, e.g., an electron beam exposure apparatus. An exposure unit 50 as the main body portion of the exposure apparatus 1 can be configured to include a substrate stage 11 which drives the substrate, a projection system 18 which projects the exposure beam such as an electron beam onto the substrate, a measurement unit 17 (e.g., an alignment scope) which measures the position of an alignment mark on the substrate, and the like. The exposure unit 50 is arranged in an exposure chamber 10 and can be maintained at a predetermined environment such as a reduced-pressure environment.

The exposure chamber 10 is connected to a load-lock chamber 12. The space in the exposure chamber 10 is connected to that in the load-lock chamber 12 through a gate valve 15. Alternatively, the exposure chamber 10 and load-lock chamber 12 may be respectively provided with gate valves. The space in the load-lock chamber 12 is connected to the external environment (atmosphere) through a gate valve 14. A holding table 13 which holds the substrate or a substrate chuck and a measurement unit (e.g., an alignment scope) 16 which measures the position of the alignment mark on the substrate are arranged in the load-lock chamber 12.

The exposure apparatus 2 forms a latent image pattern by photosensitizing a photosensitive agent applied to a substrate (e.g., a wafer or glass plate) with an exposure beam, and can be configured as, e.g., an electron beam exposure apparatus. An exposure unit 60 as the main body portion of the exposure apparatus 2 can be configured to include a substrate stage 21 which drives the substrate, a projection system 28 which projects the exposure beam such as an electron beam onto the substrate, a measurement unit 27 which measures the position of the alignment mark on the substrate, and the like. The exposure unit 60 is arranged in an exposure chamber 20 and can be maintained at a predetermined environment such as a reduced-pressure environment.

The exposure chamber 20 is connected to a load-lock chamber 22. The space in the exposure chamber 20 is connected to that in the load-lock chamber 22 through a gate valve 25. Alternatively, the exposure chamber 20 and load-lock chamber 22 may be respectively provided with gate valves. The space in the load-lock chamber 22 is connected to the external environment (atmosphere) through a gate valve 24. A holding table 23 which holds the substrate or a substrate chuck and a measurement unit (e.g., an alignment scope) 26 which measures the position of the alignment mark on the substrate are arranged in the load-lock chamber 22.

The alignment measurement device 3 can be arranged outside the exposure chambers 10 and 20 of the respective exposure apparatuses 1 and 2, typically, in an atmospheric environment. When the alignment measurement device 3 is arranged outside the exposure chambers 10 and 20, the exposure apparatuses 1 and 2 or the exposure chambers 10 and 20 can be made compact, and the alignment measurement device 3 can be shared by a plurality of (2 or more) exposure apparatuses 1 and 2. Sharing the alignment measurement device 3 contributes to downsizing of the entire exposure system configured to include the alignment measurement device 3 and the plurality of exposure apparatuses 1 and 2 which share the alignment measurement device 3. When the alignment measurement device 3 is arranged in the atmospheric environment and alignment measurement of the substrate is performed in the atmospheric environment, a load-lock chamber need not be arranged between the alignment measurement device 3 and the atmospheric environment, and the environment need not be substituted through the load-lock chamber, so as to improve the throughput of alignment measurement.

Typically, the alignment measurement device 3 measures the positions of a plurality of alignment marks on the substrate to obtain alignment information that specifies the positions of a plurality of shot regions arrayed on the substrate. After the substrate is measured by the alignment measurement device 3, it is provided together with the alignment information to an available one of the exposure apparatuses 1 and 2. The substrate is transported by a transport robot 70. The transport robot 70 can be controlled by the controller 4 to transport the substrate to, of the plurality of exposure chambers 10 and 20, one which is in a standby state or one which will finish an exposure process in progress the first. Typically, the alignment information can be provided from the alignment measurement device 3 to the corresponding exposure apparatus (the exposure apparatus to which the substrate is to be provided) through the controller 4.

According to the arrangement in which the measured substrate is provided together with the alignment information from the alignment measurement device 3 to the exposure apparatus, the exposure apparatus can measure the positions of some (at least one) of the plurality of alignment marks on the substrate, specify, on the basis of the measurement result and the alignment information provided from the alignment measurement device 3, the positions of the plurality of shot regions on the substrate, and align the pattern with the respective shot regions accurately.

The alignment measurement device 3 includes at least one alignment measurement unit, preferably, a plurality of alignment measurement units 30 and 40. Each alignment measurement unit measures the positions of the plurality of alignment marks on the substrate to obtain alignment information that specifies the positions of the plurality of shot regions on the substrate. When the plurality of alignment measurement units 30 and 40 are provided, alignment measurement for a plurality of substrates can be performed in a parallel manner. When the plurality of alignment measurement units 30 and 40 are built into the alignment measurement device 3, the entire installation area can be reduced to be smaller than in a case wherein a plurality of alignment measurement units are arranged on the floor independently of each other.

Figure 2:
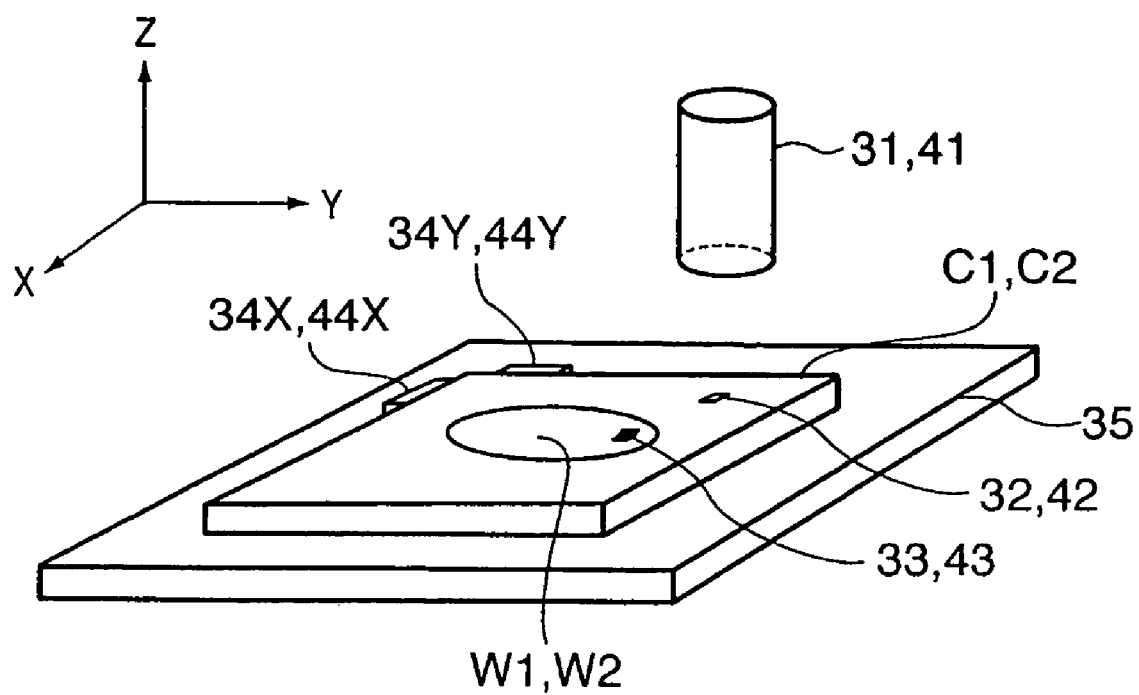
FIG. 2 is a view showing an arrangement of an alignment measurement unit.

FIG. 2 is a view showing an arrangement of the alignment measurement unit 30 or 40. Typically, the alignment measurement units 30 and 40 have the same arrangement. In FIG. 2, the constituent elements of the alignment measurement unit 40 are denoted by reference numerals in parentheses. The alignment measurement unit 30 (40) comprises a measurement stage 35 (45) on which a substrate chuck C1 (C2) is mounted, and a measurement unit (e.g., an alignment scope) 31 (41) which measures the positions of a plurality of alignment marks 33 (43) formed on a substrate W1 (W2) chucked on the substrate chuck C1 (C2). In the alignment measurement unit 30 (40), typically, the measurement stage 35 (45) is moved so an alignment mark as the measurement target enters the field of view of the measurement unit 31 (41), and the position of the alignment mark in the field of view is measured by the measurement unit 31 (41). Although FIG. 2 shows only one alignment mark 33 (43), actually, a plurality of alignment marks are formed on the substrate. The positions of those of the plurality of alignment marks, that are necessary to specify the positions of the plurality of shot regions on the substrate W1 (W2) can be measured sequentially.

The substrate chuck C1 (C2) is preferably separable from the measurement stage 35 (45). After alignment measurement is ended, the substrate chuck C1 (C2) which holds the substrate W1 (W2) is preferably transferred by the transport robot 70 onto the holding table 13 in the load-lock chamber 12 or the holding table 23 in the load-lock chamber 22.

The measurement stage 35 (45) is preferably provided with a positioning member 34X (44X) to position the substrate chuck C1 (C2) in the X direction and a positioning member 34Y (44Y) to position the substrate chuck C1 (C2) in the Y direction. In this case, the substrate chuck C1 (C2) can be positioned as it is abutted against the positioning members 34X (44X) and 34Y (44Y).

Such positioning members are preferably provided to the holding tables 13 and 23 in the respective load-lock chambers 12 and 22 and the exposure stages 11 and 21 of the respective exposure apparatuses 1 and 2 as well. Then, the relative positional relationship between a reference position on the measurement stage 35 (45) and the substrate (furthermore, the alignment mark), the relative positional relationship among respective reference positions on the holding table 13 and exposure stage 11 and the substrate (furthermore, the alignment mark), and the relative positional relationship among respective reference positions on the holding table 23 and exposure stage 21 and the substrate (furthermore, the alignment mark) can be set to coincide with each other.

Typical operation in the exposure system shown in FIG. 1 will be illustratively described hereinafter.

First, under the control of the controller 4, the substrate chuck C1 which holds the substrate W1 is transferred to an available one (in this case, the alignment measurement unit 30 for the sake of practical explanation) of the plurality of alignment measurement units 30 and 40 by the transport robot (not shown), and is fixed on the measurement stage 35 while being positioned with respect to the positioning members 34X and 34Y.

Subsequently, the alignment measurement unit 30 measures the positions (including the position (X1, Y1) of the alignment mark 33) of the plurality of alignment marks on the substrate W1 to obtain alignment information that specifies the positions of the plurality of shot regions on the substrate W1, and sends the alignment information to the controller 4. The alignment measurement unit 30 also measures the position (X, Y) of a reference mark 32 of the substrate chuck C1 and sends the measurement result to the controller 4.

Subsequently, the substrate W1, the positions of the alignment marks on which have been measured, and the substrate chuck C1 which holds the substrate W1 are transported under the control of the controller 4 to an available one (in this case, the exposure apparatus 1 for the sake of practical explanation) of the plurality of exposure apparatuses 1 and 2 by the transport robot 70. Preferably, the controller 4 controls the transport robot 70 so as to transport the substrate to the exposure apparatus 1 or 2, which is in a standby state or which will finish an exposure process in progress the first.

The substrate W1 and the substrate chuck C1 which holds it can be transported to the exposure apparatus 1 by opening the gate valve 14 and transferring the substrate chuck C1 to the holding table 13 by the transport robot 70 such that the substrate chuck C1 is abutted against the positioning members provided to the holding table 13 in the load-lock chamber 12. Then, the substrate W1 and the substrate chuck C1 which holds it are aligned at the reference position on the holding table 13. At this stage, the atmosphere in the load-lock chamber 12 is the same as the atmosphere, and the gate valve 15 has been closed. After the substrate W1 and the substrate chuck C1 which holds it are removed from the alignment measurement unit 30, a substrate chuck that holds the next substrate is transferred to the alignment measurement unit 30.

When the substrate chuck C1 which holds the substrate W1 is placed on the holding table 13, the gate valve 14 is closed. When the load-lock chamber 12 reaches the same environment (e.g., the same vacuum degree) as that of the exposure chamber 10, the gate valve 15 is opened. The substrate W1 and the substrate chuck C1 which holds it are transported by a transport mechanism (not shown) from the holding table 13 in the load-lock chamber 12 onto the exposure stage 11 in the exposure chamber 10. During this transport, the substrate chuck C1 is abutted against the positioning members provided to the exposure stage 11. Thus, the substrate W1 and the substrate chuck C1 which holds it are aligned with the reference position on the exposure stage 11. After that, the gate valve 15 is closed to separate the exposure chamber 10 and load-lock chamber 12 from each other.

Subsequently, the substrate chuck C1 which holds the substrate W1 is driven by the exposure stage 11 such that the reference mark 32 of the substrate chuck C1 enters the visual field of the measurement unit 17. After that, the position (X', Y') of the reference mark 32 is measured by the measurement unit 17. The substrate chuck C1 is driven by the exposure stage 11 such that the alignment mark 33 of the substrate W1 enters the visual field of the measurement unit 17. After that, the position (X2, Y2) of the alignment mark 33 is measured by the measurement unit 17.

The difference between the position (X, Y) of the reference mark 32 and the position (X1, Y1) of the alignment mark 33 measured by the alignment measurement unit 30 in the first environment (typically the atmospheric environment), that is, ($\Delta X1$, $\Delta Y1$)=(X−X1, Y−Y1) signifies the distances in the X and Y directions between the reference mark 32 and alignment mark 33 in the first environment (typically, the atmospheric environment). The difference between the position (X', Y') of the reference mark 32 and the position (X2, Y2) of the alignment mark 33 measured by the alignment measurement unit 17 in the second environment (exposure environment), that is, ($\Delta X2$, $\Delta Y2$)=(X'−X2, Y'−Y2) signifies the distances in the X and Y directions between the reference mark 32 and alignment mark 33 in the second environment (exposure environment).

The controller 4 comprises a shrinkage factor arithmetic operation unit 81 and correction unit 82. The shrinkage factor arithmetic operation unit 81 calculates the ratio ($\Delta X2/\Delta X1$) of $\Delta X2$ to $\Delta X1$ and the ratio ($\Delta Y2/\Delta Y1$) of $\Delta Y2$ to $\Delta Y1$. $\Delta X2/\Delta X1$ indicates the shrinkage factor of the substrate (rate of change of the substrate size) in the X direction due to a temperature change caused by adiabatic expansion or the like which occurs when the surrounding environment of the substrate changes from the first environment (typically, the atmospheric environment) to the second environment (exposure environment). $\Delta Y2/\Delta Y1$ indicates the shrinkage factor of the substrate (rate of change of the substrate size) in the Y direction due to a temperature change caused by adiabatic expansion or the like which occurs when the surrounding environment of the substrate changes from the first environment (typically, the atmospheric environment) to the second environment (exposure environment).

The correction unit 82 multiplies the alignment information (information indicating the respective positions of the plurality of alignment marks or of the regions to be exposed to radiation in the first environment) on the substrate W1 provided from the alignment measurement unit 30 by the shrinkage factor ($\Delta X2/\Delta X1$ in the X direction, and $\Delta Y2/\Delta Y1$ in the Y direction) calculated by the shrinkage factor arithmetic operation unit 81 as a correction coefficient, to calculate the respective positions of the plurality of alignment marks or of the regions to be exposed to radiation in the second environment (exposure environment), and sends the calculated positions to the exposure apparatus 1. The exposure apparatus 1 (exposure unit 50) performs exposure operation on the basis of the alignment information (corrected alignment information) received from the correction unit 82. More specifically, the exposure apparatus 1 (exposure unit 50) aligns the respective shot regions on the substrate within the projection region (exposure region) of the projection system 18 on the basis of the alignment information (corrected alignment information) sent from the correction unit 82, and forms latent image patterns on the respective shot regions.

In the exemplificative embodiment described above, the correction coefficient which depends on the shrinkage factors of the substrate and substrate chuck is obtained on the basis of the position (X2, Y2) of one alignment mark in addition to the position of the reference mark formed on the substrate chuck. Where necessary, the positions of several alignment marks may be measured, and the correction coefficient may be obtained from, e.g., their average. Alternatively, without using the reference mark formed on the substrate chuck, the correction coefficient may be obtained on the basis of the position of at least one arbitrary alignment mark or another characteristic portion on the substrate.

Furthermore, the measurement units 16 and 26 may be arranged in the load-lock chambers 12 and 22, respectively. After the change from the first environment (typically, the atmospheric environment) to the second environment (exposure environment), the measurement units 16 and 26 may measure the position (X3, Y3) of the alignment mark on the substrate W1 (W2) and the position (X", Y") of the reference mark on the substrate chuck C1 (C2).

In this case, the shrinkage factor arithmetic operation unit 81 calculates the ratio ($\Delta X3/\Delta X1$) of $\Delta X3$ (=X'−X3) to $\Delta X1$ (=X−X1) and the ratio ($\Delta Y3/\Delta Y1$) of $\Delta Y3$ (=Y'−Y3) to $\Delta Y1$ (=Y−Y1). $\Delta X3/\Delta X1$ indicates the shrinkage factor of the substrate (rate of change of the substrate size) in the X direction due to a temperature change caused by adiabatic expansion or the like which occurs when the surrounding environment of the substrate changes from the first environment (typically, the atmospheric environment) to the second environment (exposure environment). $\Delta Y3/\Delta Y1$ indicates the shrinkage factor of the substrate (rate of change of the substrate size) in the Y direction due to a temperature change caused by adiabatic expansion or the like which occurs when the surrounding environment of the substrate changes from the first environment (typically, the atmospheric environment) to the second environment (exposure environment).

The correction unit 82 multiplies the alignment information (information indicating the respective positions of the plurality of alignment marks in the first environment) on the substrate W1 sent from the alignment measurement unit 30 by the shrinkage factor ($\Delta X3/\Delta X1$ in the X direction and $\Delta Y3/\Delta Y1$ in the Y direction) calculated by the shrinkage factor arithmetic operation unit 81 as a correction coefficient, to calculate the respective positions of the plurality of alignment marks in the second environment (exposure environment), and outputs the calculated positions to the exposure apparatus 1.

In place of obtaining the correction coefficient which depends on the shrinkage factors of the substrate and substrate chuck on the basis of the position (X3, Y3) of one alignment mark in addition to the reference mark formed on the substrate chuck, where necessary, the positions of several alignment marks may be measured, and the correction coefficient may be obtained from, e.g., their average. Alternatively, without using the reference mark on the substrate chuck, the correction coefficient can be obtained on the basis of the position of at least one arbitrary alignment mark or another characteristic portion on the substrate.

When measurement for calculating the correction coefficient is to be performed in the load-lock chambers 12 and 22, measurement for calculating the correction coefficient in the exposure chambers 10 and 20 can be omitted. When measurement for calculating the correction coefficient is to be performed in the load-lock chambers 12 and 22, this measurement can be performed in the load-lock chambers 12 and 22 while performing exposure in the exposure chambers 10 and 20. Thus, the throughput can be improved. Naturally, measurement for calculating the correction coefficient can be performed in both the load-lock chambers and exposure chambers.

Furthermore, in the load-lock chambers 12 and 14, the reference mark position of the substrate chuck and the position of the alignment mark on the substrate (or the positions of at least two alignment marks on the substrate) before substitution from the first environment to the second environment may be measured. In the exposure chambers 10 and 20, the reference mark position of the substrate chuck and the position of the alignment mark on the substrate (or the positions of at least two alignment marks on the substrate) in the second environment may be measured.

Furthermore, the shrinkage factor arithmetic operation unit 81 and correction unit 82 may form one unit (e.g., a correction/arithmetic operation unit), or part of the exposure apparatus or alignment measurement device.

Furthermore, in place of the arrangement in which the substrate is transported as it is held by the substrate chuck, an arrangement in which only the substrate is transported can be employed. In this case, the substrate chuck can be arranged on the measurement stage of the alignment measurement unit, the holding table in the load-lock chamber, or the exposure stage on the exposure chamber.

The exposure apparatus can be formed as, e.g., an EUV exposure apparatus, other than a charged particle beam exposure apparatus such as an electron beam exposure apparatus. Alternatively, the exposure apparatus can be formed as an $F_2$ laser exposure apparatus. In this case, the space in the exposure apparatus can be typically a nitrogen atmosphere.

According to the preferred embodiment of the present invention, the alignment measurement device is arranged outside the exposure chamber where the exposure unit is also located. The positions of the plurality of alignment marks on the substrate are measured by the alignment measurement device so as to obtain alignment information that specifies the positions of the plurality of shot regions on the substrate. Thus, the arrangement for alignment measurement, which is to be arranged in the exposure chamber, can be made compact. As a result, the exposure chamber is made compact to facilitate control of the environment in the exposure chamber, and an arrangement (e.g., a vacuum device or purge device) necessary for the control is made compact. Facilitation of the environment control in the exposure chamber shortens the time required to set the interior of the exposure chamber to a predetermined environment, thus contributing to an improvement in throughput.

If the first environment where the alignment measurement device performs measurement and the second environment where the exposure apparatus performs exposure are different, a measurement error due to a size change of the substrate caused by the difference in environment may be corrected, so that the pattern can be overlaid highly accurately.

The following embodiment provides a device manufacturing method to which the exposure apparatus according to the present invention is applied. A semiconductor device manufacturing method will be exemplified here.

Figure 3:
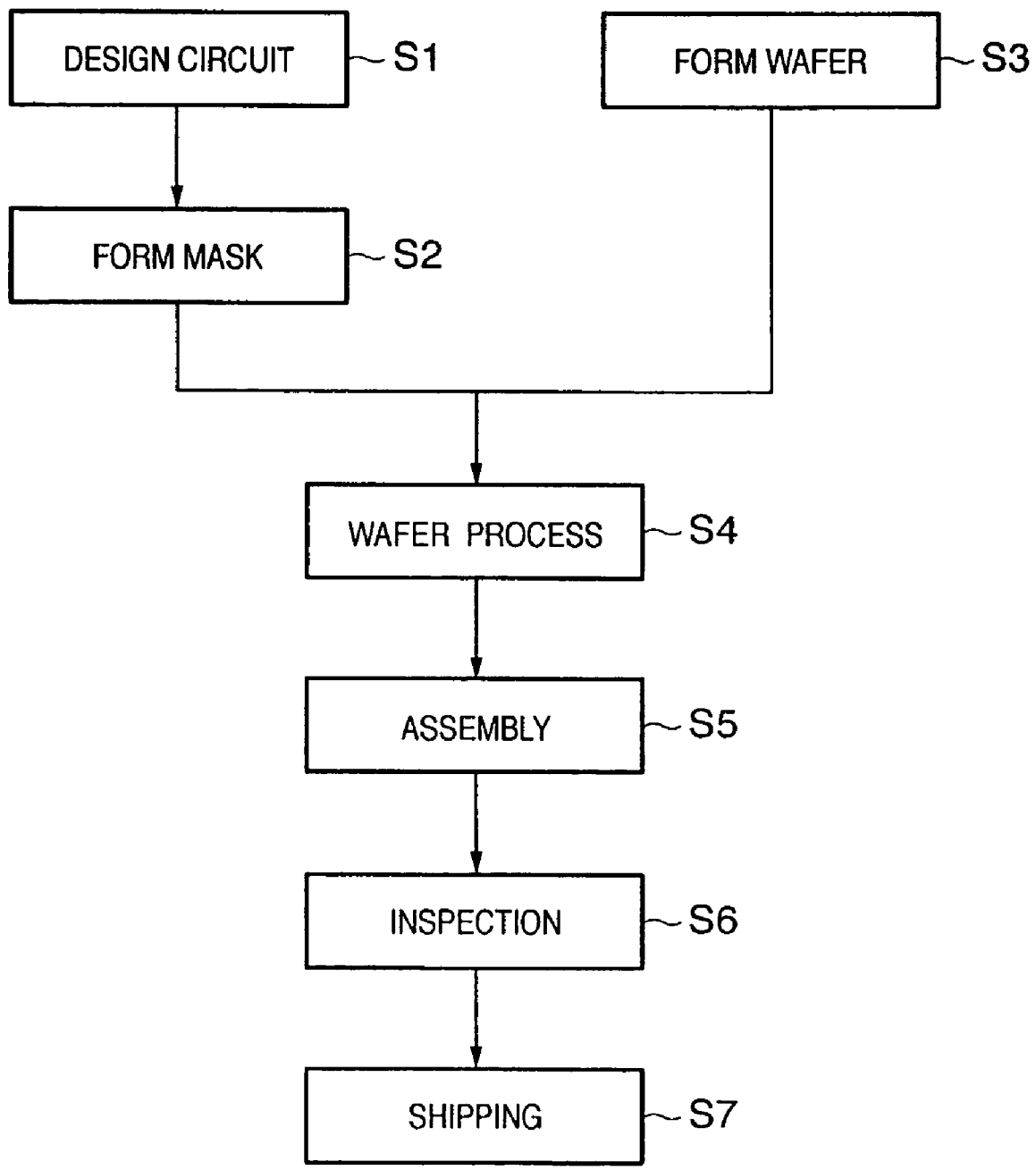
FIG. 3 is a flowchart showing the flow of the overall semiconductor device manufacturing process.

A semiconductor device manufacturing process using the above-described exposure apparatus will be described below. FIG. 3 is a flowchart showing the flow of the overall semiconductor device manufacturing process. In step S1 (circuit design), a semiconductor device circuit is designed. In step S2 (mask fabrication), a mask (also called an original plate or reticle) is fabricated on the basis of the designed circuit pattern. In step S3 (wafer manufacture), a wafer (also called a substrate) is manufactured using a material such as silicon. In step S4 (wafer process) called a pre-process, an actual circuit is formed on the wafer by lithography using the mask and wafer. In step S5 (assembly) called a post-process, a semiconductor chip is formed by using the wafer manufactured in step S4. This step includes an assembly step (dicing and bonding) and packaging step (chip encapsulation). In step S6 (inspection), the semiconductor device manufactured in step S5 undergoes inspections such as an operation confirmation test and durability test. After these steps, the semiconductor device is completed and shipped (step S7).

Figure 4:
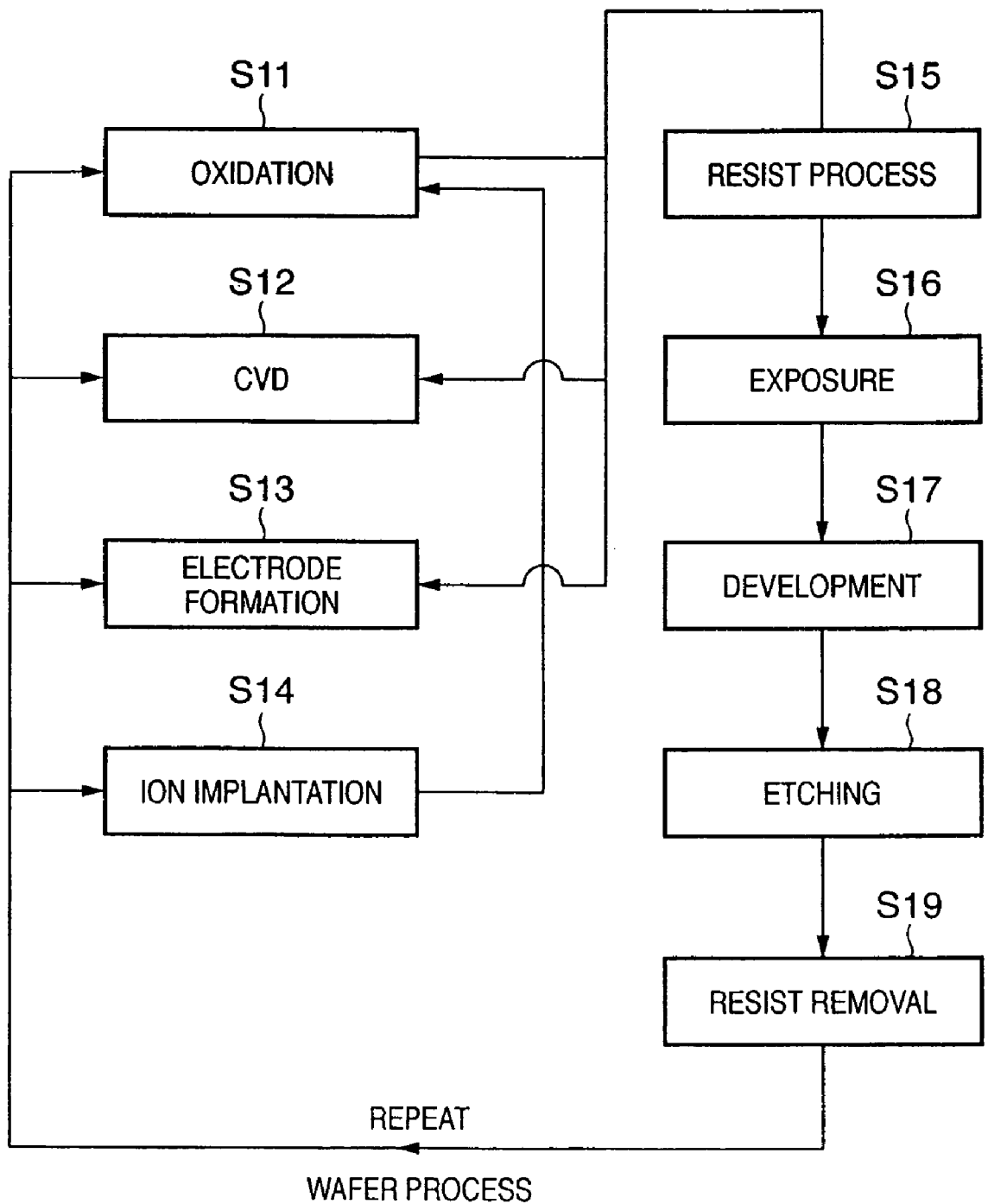
FIG. 4 is a flowchart showing the detailed flow of the wafer process.

FIG. 4 shows the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the exposure apparatus according to the present invention is caused to expose the wafer on which the resist is coated to radiation via the mask on which the circuit pattern is formed to form a latent image pattern. In step S17 (development), the latent image pattern formed on the wafer coated with the photosensitive agent is developed. In step S18 (etching), portions other than the developed resist image are etched. In step S19 (resist removal), any unnecessary resist remaining after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the appended claims.

This application claims the benefit of Japanese Application No. 2005-107739 filed on Apr. 4, 2005, which is hereby incorporated by reference herein in its entirety.

What is claimed is:

1. An exposure system for exposing a substrate to radiation, said system comprising:
   an exposure unit configured to expose the substrate to radiation; an exposure chamber configured to accommodate said exposure unit;
   an alignment measurement unit arranged outside said exposure chamber and configured to measure a position positions of a plurality of alignment mark marks, on the substrate, arranged to obtain alignment information that specifies positions of a plurality of shot regions arranged on the substrate;

a load-lock chamber arranged between said exposure chamber and said alignment measurement unit; and further comprising an alignment score arranged in at least one of said load-lock chamber and said exposure chamber and configured to measure positions of the alignment marks, and a controller configured to calculate a position of a region to be exposed to radiation on the substrate based on a first measurement performed by said alignment measurement unit and a second measurement performed by said alignment scope, wherein said alignment scope measures positions of the alignment marks fewer than the alignment marks of which positions said alignment measurement unit measures.

2. A system according to claim 1, wherein said system includes a plurality of combinations each of which includes said exposure unit, said exposure chamber and said load-lock chamber, and said alignment measurement unit is configured to be shared by said plurality of combinations.

3. A system according to claim 1, wherein said system includes a plurality of said alignment measurement units.

4. A system according to claim 1, wherein said controller is configured to correct the position of the region, which is obtained based on the first measurement, based on the first measurement and the second measurement.

5. An exposure method of exposing a substrate to radiation, said method comprising steps of:

performing, using an alignment measurement unit, first measurement of a positions of a plurality of alignment marks on the substrate in order to obtain alignment information that specifies positions of a plurality of shot regions arranged on the substrate, outside an exposure chamber which accommodates an exposure unit configured to exposure the substrate to radiation;

conveying the substrate, for which the first measurement has been performed, into the exposure chamber through a load-lock chamber;

aligning, in the exposure chamber, the conveyed substrate based on the first measurement;

exposing, in the exposure chamber, the aligned substrate to radiation using the exposure unit; and performing second measurement of positions of the alignment marks using an alignment score arranged in at least one of the load-lock chamber and the exposure chamber; and calculating a position of a region to be exposed to radiation on the substrate based on the first measurement and the second measurement, wherein said second measurement step measures positions of alignment marks fewer than alignment marks of which positions said first measurement step measures.

6. A method according to claim 5, wherein said method employs a plurality of combinations each of which includes the exposure unit, the exposure chamber and the load-lock chamber, and the alignment measurement unit is shared by the plurality of combinations.

7. A method according to claim 5, wherein said method employs a plurality of the alignment measurement units.

8. A method according to claim 5, wherein said calculating step corrects the position of the region, obtained based on the first measurement, based on the first measurement and the second measurement.

9. A method of manufacturing a device, said method comprising steps of:

exposing a substrate to radiation using an exposure system as defined in claim 1;

developing the exposed substrate; and processing the developed substrate to manufacture the device.

10. An exposure system for exposing a substrate to radiation, said system comprising:

an exposure unit configured to expose the substrate to radiation;

an exposure chamber configured to accommodate said exposure unit and to maintain the inside of the exposure chamber at a reduced-pressure environment;

an alignment measurement unit arranged outside said exposure chamber and configured to measure positions of a plurality of alignment marks arranged to obtain alignment information that specifies positions of a plurality of shot regions arranged on the substrate; and a controller configured to correct a measurement result performed by said alignment measurement unit based on change in the substrate size caused by changes in the environment of the substrate when the substrate is placed from the outside to the inside of the exposure chamber and to control the alignment of the substrate based on the corrected measurement result.

11. A system according to claim 10, wherein the controller comprises:

a shrinkage factor arithmetic operation unit which calculates a shrinkage factor which is a ratio of the substrate size when the substrate is positioned outside the exposure chamber to the substrate size when the substrate is positioned inside the exposure chamber; and a correction unit which multiplies the alignment information provided from the alignment measurement unit by the shrinkage factor calculated by the shrinkage factor arithmetic operation unit to calculate positions of the alignment marks when the substrate is positioned inside the exposure chamber.

12. A method of manufacturing a device, said method comprising steps of:

exposing a substrate to radiation using an exposure system as defined in claim 10;

developing the exposed substrate; and processing the developed substrate to manufacture the device.

* * * * *